US006329235B1

(12) United States Patent
Kuo

(10) Patent No.: US 6,329,235 B1
(45) Date of Patent: Dec. 11, 2001

(54) METHOD OF PERFORMING A POCKET IMPLANTATION ON A MOS TRANSISTOR OF A MEMORY CELL OF A DRAM

(75) Inventor: Chien-Li Kuo, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/421,259

(22) Filed: Oct. 20, 1999

(51) Int. Cl.[7] .................................................. H01L 21/8234

(52) U.S. Cl. ........................ 438/238; 438/197; 438/200; 438/279; 438/302; 438/306; 438/305; 257/408

(58) Field of Search ..................................... 438/238, 197, 438/514, 200, 305, 279, 302, 306; 257/408

(56) References Cited

U.S. PATENT DOCUMENTS

| 5,998,284 | * | 12/1999 | Azuma ................................. | 438/514 |
| 6,008,080 | * | 12/1999 | Chuang et al. ....................... | 438/200 |
| 6,174,778 | * | 6/2001 | Chen et al. ........................... | 438/302 |

OTHER PUBLICATIONS

Hori et al., High–Performance Dual –Gate CMOS Utilizing a Novel Self–Aligned Pocket Implantation (SPI) Technology., IEEE Transactions On Electron Devices. vol. 40, No. 9, Sep. 1993.*

* cited by examiner

Primary Examiner—Caridad Everhart
Assistant Examiner—Belur V Keshavan
(74) Attorney, Agent, or Firm—Winston Hsu

(57) ABSTRACT

This invention provides a method of performing a pocket implantation on a MOS transistor of a memory cell of a DRAM. The DRAM on a predetermined area of a semiconductor wafer comprises memory cells arranged in a matrix format. Each memory cell comprises an N-type MOS transistor which comprises gate electrode layer, two spacers on two opposite side walls of the gate electrode layer, two lightly doped layers on the surface of the substrate below the two spacers, and two heavily doped layers act as the source and drain. This method uses two ion implantation processes to implant boron ions first into a region below one of the two lightly doped layers in a specified direction to form a first pocket implantation region, and then into a region below the other lightly doped layer in the opposite direction to form a second pocket implantation region so as to complete the pocket implantation.

6 Claims, 4 Drawing Sheets

METHOD OF PERFORMING A POCKET IMPLANTATION ON A MOS TRANSISTOR OF A MEMORY CELL OF A DRAM

BACKGROUND OF THE INVENTION

1. Field of the Invention

The present invention relates to a method of performing a pocket implantation on a metal-oxide semiconductor (MOS) transistor, and more particularly, to a method of performing a pocket implantation on a MOS transistor for a memory cell of a dynamic random access memory (DRAM).

2. Description of the Prior Art

In the formation of DRAM, the gate width of the MOS transistor that serves as the pass transistor of the memory cell continues to shrink to increase the integration of the semiconductor wafer and enhance the reading rate of memory data. Recently, the DRAM fabrication process has begun to employ a pocket implantation (halo implantation) process to adjust the punch-through voltage of the pass transistor to prevent punch-through between the source and the drain of the pass transistor. The pocket implantation process forms two pocket doped regions in the silicon substrate below the lightly doped drain (LDD) or below the source and the drain to prevent punch-through between the source and drain. The pocket doped regions also lower the carrier concentration in the PN junction between the silicon substrate and the bottom layer of the source and drain, which reduces the PN junction capacitance and thereby enhances the operational rate of the MOS transistor.

Please refer to FIG. 1 and FIG. 2. FIG. 1 is a top view of a transistor 14 of a memory cell 12 of a DRAM 10 according to the prior art. FIG. 2 is a sectional view along line 2—2 of the memory cell 12 of the DRAM 10 shown in FIG. 1. The DRAM 10 is formed on a predetermined area of a semiconductor wafer and comprises a plurality of memory cells 12 arranged in a matrix format on the predetermined area.

Each of the memory cells 12 of the DRAM 10 comprises a capacitor to store electrical charge, and an N-type MOS (NMOS) transistor 14 electrically connected with a lower storage node 16 of the capacitor. Each NMOS 14 serves as a pass transistor for the memory cell 12, and comprises a substrate 18, a gate electrode layer 20 with a rectangular vertical cross section positioned on the substrate 18 along a predetermined direction, two spacers 22 positioned on the substrate 18 along two opposite side walls of the gate electrode layer 20, two lightly doped layers 24 positioned on the surface of the substrate 18 below the two spacers 22 of two adjacent gate electrode layers 20, and two heavily doped layers positioned on the surface of the substrate 18 next to the two opposite side walls of the gate electrode layer 20 and not covered by the two spacers 22. The lightly doped layer 24 and the heavily doped layer act as the LDD and the source/drain 26 of the NMOS 14, respectively. A contact hole 28 is formed between the partial side walls of the spacer 22 of two adjacent NMOS 14 and above the source/drain 26, then the lower storage node 16 is formed inside the contact hole 28 above the source/drain 26. The substrate 18 comprises a doped region 38 be low and around the source/drain 26.

Please refer to FIG. 3. FIG. 3 is a schematic diagram of the formation of the doped region 38 below the NMOS 14 shown in FIG. 1 and FIG. 2. The doped region 38 is formed by a pocket implantation process after forming the NMOS 14. The pocket implantation process according to the prior art is performed by carrying on ion implantation processes in four different implanting directions. First, an ion implantation process implants ions into the substrate 18 along a specified direction 30 at a predetermined tilt angle $\theta_P$. Then, the ion implantation process implants ions along the specified directions 32, 34 and 36 in sequence at the same tilt angle $\theta_P$ to complete the pocket implantation region 38. In FIG. 3, four dotted lines 31a, 33a, 35a and 37a are parallel with the surface of the substrate 18, four dotted lines 31b, 33b, 35b and 37b are vertical to the surface of the substrate 18, and the arrows 30, 32, 34 and 36 indicate four implanting directions at the predetermined tilt angle $\theta_P$ in the pocket implantation process according to the prior art.

The pocket implantation process according to the prior art repeats the ion implantation process in four implanting directions in the region between two adjacent gate electrode layers 20, which results in a considerably high carrier concentration in the surface layer of the substrate 18 below that region, especially below the contact hole 28. The repetitive ion implantation processes may destroy the crystalline structure in the surface layer of the substrate 18, and the high carrier concentration increases the storage node junction electric field, which increases the junction leakage current. This higher leakage current can cause a more rapid loss of charge in the capacitor, which may adversely effect storage charge refresh times, or even cause mistakes in stored data.

SUMMARY OF THE INVENTION

It is therefore a primary objective of the present invention to provide a method of performing a pocket implantation on a MOS transistor of a memory cell of a DRAM to solve the problem of high carrier concentrations between the gate conductive layer due to repetitive ion implantation processes.

In a preferred embodiment, the present invention provides a method of performing a pocket implantation on a MOS transistor of a memory cell of a DRAM. The DRAM is formed on a predetermined area of a semiconductor wafer and comprises a plurality of memory cells arranged in a matrix format on the predetermined area. Each of the memory cells comprises a transistor which comprises a substrate, a gate electrode layer with a rectangular vertical cross section positioned on the substrate, two spacers positioned on two opposite side walls of the gate electrode layer, two lightly doped layers positioned on the surface of the substrate below the two spacers, and two heavily doped layers positioned on the surface of the substrate next to the two opposite side walls of the gate electrode layer and not covered by the two spacers. The method comprises:

performing a first ion implantation process to implant ions into a region below one of the two lightly doped layers in a first direction to form a first pocket implantation region; and performing a second ion implantation process to implant ions into a region below the other lightly doped layer in a second direction to form a second pocket implantation region;

wherein the angle between the first direction and the surface of the semiconductor wafer is the same as the angle between the second direction and the surface of the semiconductor wafer, and the horizontal direction projected from the first direction over the surface of the semiconductor wafer is opposite to that of the second direction.

It is an advantage of the present invention that the method is self-aligning and selective to maintain completeness of the crystalline structure and to maintain carrier concentrations below the contact hole of the lower storage node.

These and other objectives of the present invention will no doubt become obvious to those of ordinary skill in the art

DETAILED DESCRIPTION OF THE PREFERED EMBODIMENT

Figure 1:
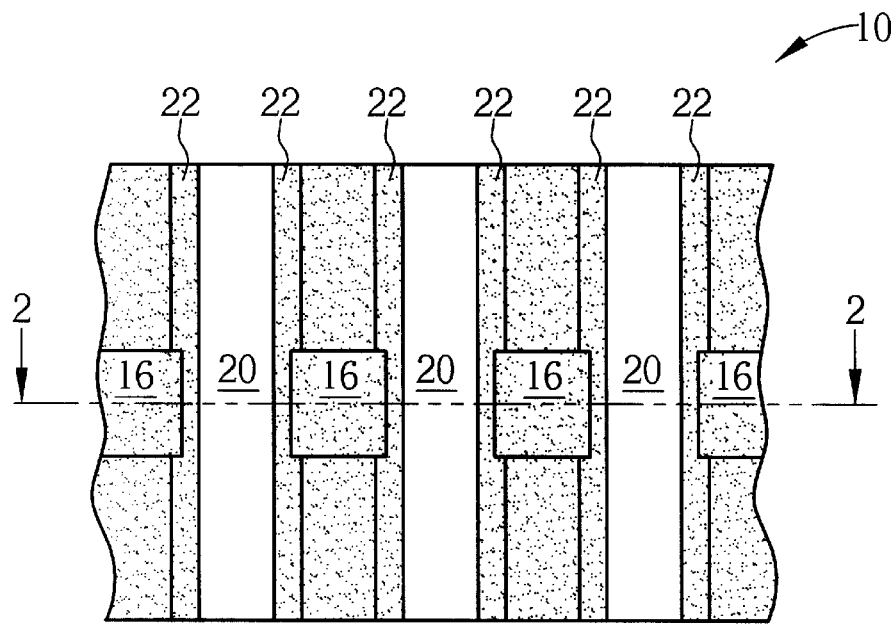
FIG. 1 is a top view of a transistor of a memory cell of a DRAM according to the prior art.
Figure 2:
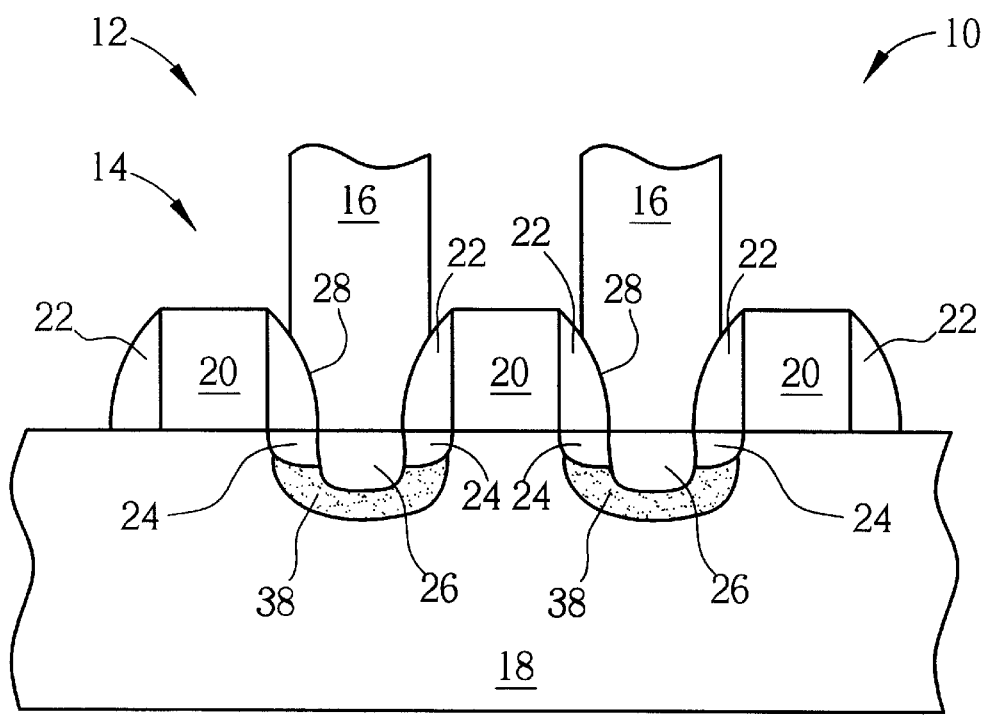
FIG. 2 is a sectional view along line 2—2 of the memory cell of the DRAM shown in FIG. 1.
Figure 3:
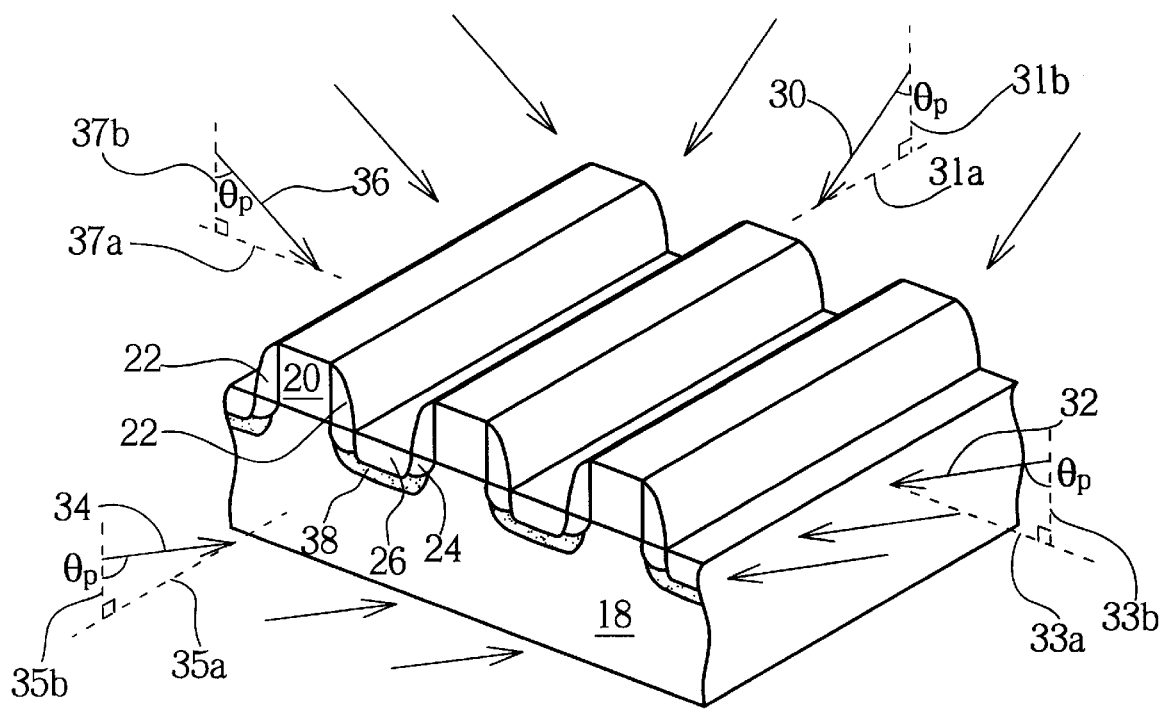
FIG. 3 is a schematic diagram of the formation of the doped region below the NMOS shown in FIG. 1 and FIG. 2.
Figure 4:
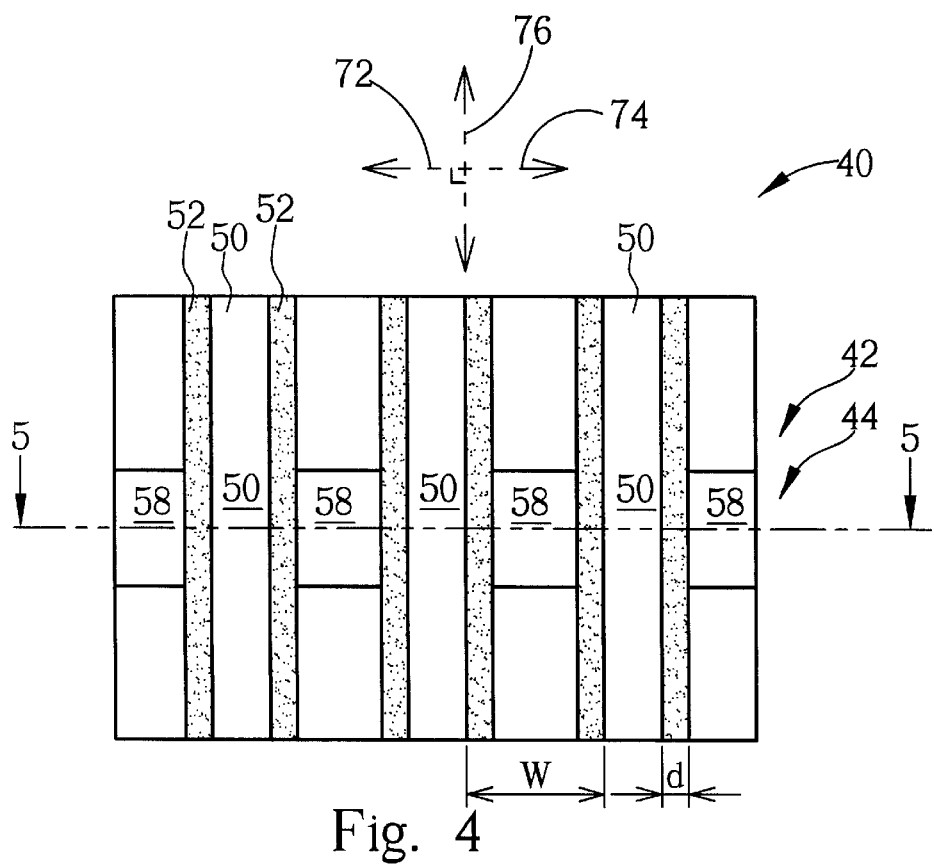
FIG. 4 is a top view of a NMOS of a memory cell according to the present invention.
Figure 5:
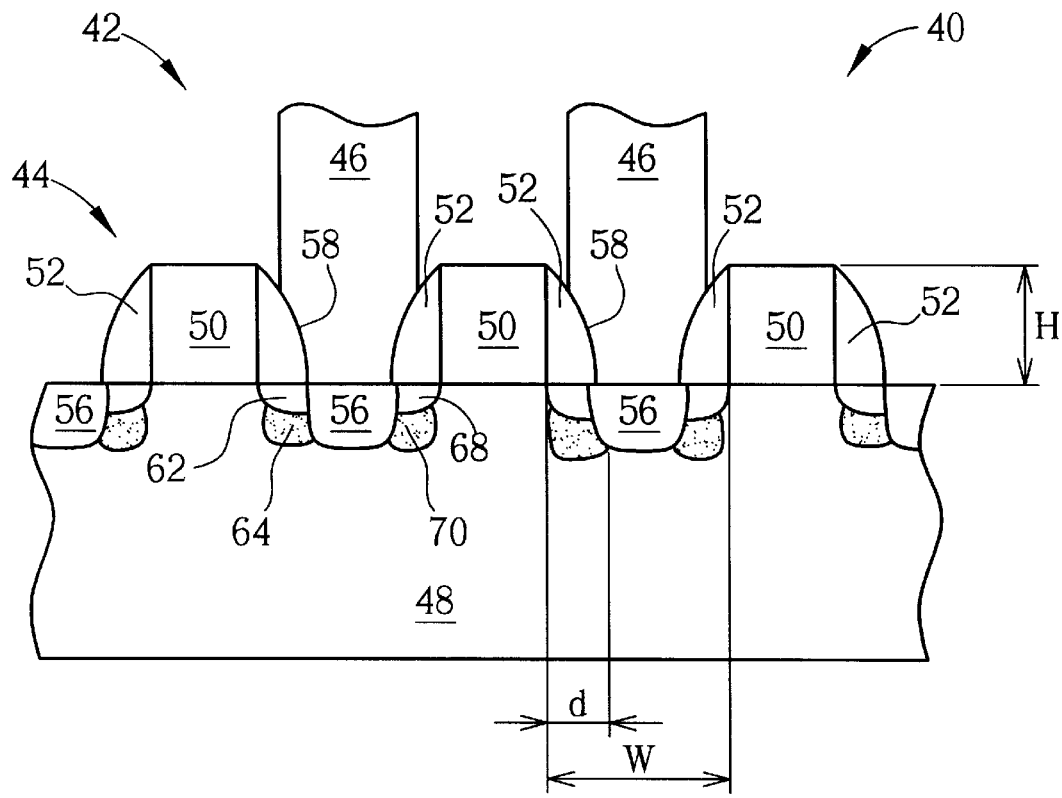
FIG. 5 is a sectional view along line 5—5 of the memory cell shown in FIG. 4.

Please refer to FIG. 4 and FIG. 5. FIG. 4 is a top view of a NMOS 44 of a memory cell 42 according to the present invention. FIG. 5 is a sectional view along line 55 of the NMOS 44 of the memory cell 42 of the DRAM shown in FIG. 4. The present invention is a method of performing a pocket implantation on a MOS transistor of a memory cell of a DRAM. The DRAM is formed on a predetermined area of a semiconductor wafer 40 and comprises a plurality of memory cells 42 arranged in a matrix format on the predetermined area. Each of the memory cells 42 comprises a capacitor (not shown) to store electrical charge and an NMOS transistor 44 electrically connected with a lower storage node 46 of the capacitor. Each NMOS transistor 44 serves as a pass transistor for the memory cell 42.

The NMOS transistor 44 comprises a substrate 48, a gate electrode layer 50 with a rectangular vertical cross section positioned on the substrate 48 along a predetermined direction, two spacers 52 positioned on the substrate 48 along two opposite side walls of the gate electrode layer 50, two lightly doped layers 62 positioned on the surface of the substrate 48 below the two spacers 52, and two heavily doped layers positioned on the surface of the substrate 48 next to the two opposite side walls of the gate electrode layer 50 and not covered by the two spacers 52. The lightly doped layer 62 and the heavily doped layer act as an LDD and the source/drain 56 of the NMOS 44, respectively. A contact hole 58 is formed between the partial side walls of the spacer 52 of two adjacent NMOS transistors 44 and the surface of the substrate 48 not covered by the two spacers 52. The lower storage node 46 is formed inside the contact hole 58 above the source/drain 56, and the contact hole 58 serves as a channel for connecting the lower storage node 46 and the source/drain 56 of the substrate 48. The main doping impurity of the two lightly doped layers 62 and the source/drain 56 is phosphorous (P).

Figure 6:
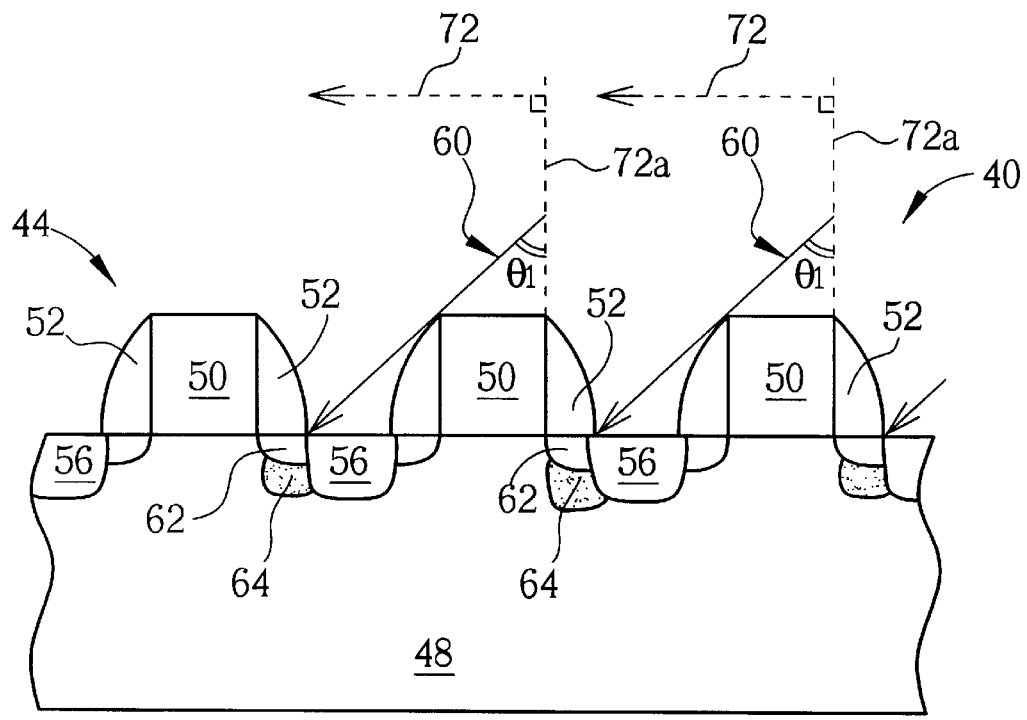
FIG. 6 and FIG. 7 are schematic diagrams of the pocket implantation process according to the present invention.
Figure 7:
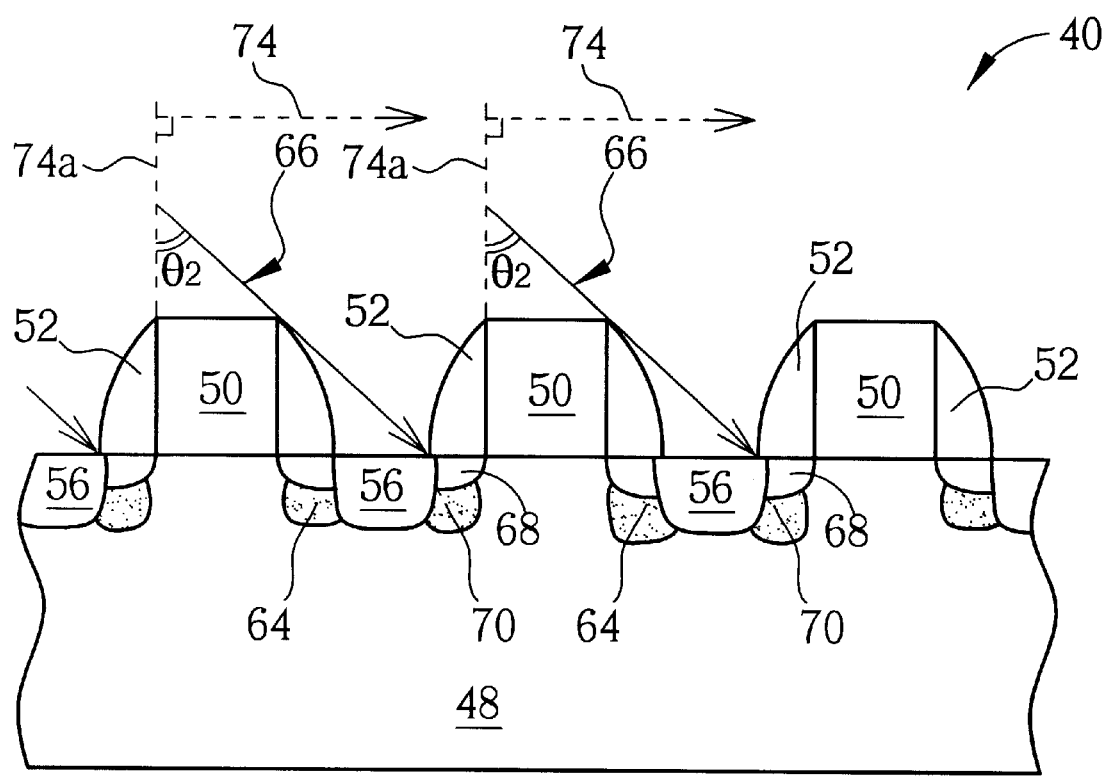

Please refer to FIG. 6 and FIG. 7. FIG. 6 and FIG. 7 are schematic diagrams of the pocket implantation process according to the present invention. The invention method of performing a pocket implantation is applied to the semiconductor wafer 40 when the NMOS transistor 44 and contact hole 58 are formed but the lower storage node 46 is not yet formed. The method performs a first ion implantation process to implant ions into a region below one of the two lightly doped layers 62 of each NMOS transistor 44 in first direction 60 related to the semiconductor wafer 40 to form a first pocket implantation region 64. Next, a second ion implantation process is performed to implant ions into a region below the other lightly doped layer 68 in a second direction 66 related to the semiconductor wafer 40 to form a second pocket implantation region 70. Both the first and the second ion implantation processes employ boron (B) as the main doping ion, and the first direction 60 and the second direction 66 are both perpendicular to a direction of the channel width of the transistor. Thus, the pocket implantation process of the NMOS transistor 44 is completely performed.

In the present invention method of performing the pocket implantation, a horizontal direction 72 projected from the first direction 60 over the surface of the semiconductor wafer 40 is opposite to a horizontal direction 74 projected from the second direction 66, and the horizontal directions 72, 74 are both perpendicular to the direction of the gate electrode layer 50 positioned on the substrate 48, as shown by arrow 76 in FIG. 4. Furthermore, the angle between the first direction 60 and the surface of the semiconductor wafer 40 is the same as the angle between the second direction 66 and the surface of the semiconductor wafer 40. In FIG. 6 and FIG. 7, the dotted lines 72a, 74a are vertical to the surface of the semiconductor wafer 40, and the angle $\theta_1$ between the first direction 60 and the dotted line 72a is the same as the angle $\theta_2$ between the second direction 66 and the dotted line 74a ($\theta_1=\theta_2$). This means that the first and the second ion implantation processes employ the same pocket implant angle, i.e. $\theta_1=\theta_2=$ a fixed angle θ. The pocket implant angle according to the present invention is determined by the following formula:

$$\tan\theta=(W-d)/H$$

where W is the distance between two gate electrode layers 50, d is the width of the pocket implantation region, and H is the height of the gate electrode layer 50 (shown in FIG. 5). The present invention method of performing a pocket implantation takes advantage of the shadowing effect from the height of the gate electrode layer 50 to determine the pocket implant angle θ which will restrict the implantation ions to a region in the contact hole 58 below the lower storage node 46. Thus, the present invention avoids affecting the carrier concentration in the source/drain 56 and thus avoids affecting the performance of the NMOS 44. The present invention also avoids damage to the crystalline structure of the surface of the substrate 48.

The invention method of performing a pocket implantation uses two ion implantation processes in which the angle between the first direction 60 and the semiconductor wafer 40 (90–$\theta_1$) is the same as the angle between the second direction 66 and the semiconductor wafer 40 (90–$\theta_2$), and the direction projected from the first direction 60 over the surface of the semiconductor wafer 40 is opposite to the projection of the second direction 66. The present invention method selects the pocket implant angle θ to utilize the height of the gate electrode layer 50 to create a shadowing effect. The present invention method is thus self-aligning and selective to implant ions into the region below the lightly doped layers 62 and 68 and not into the source/drain 56 of the NMOS transistor 44. This eliminates the need for two additional ion implantation processes. Furthermore, it ensures that the carrier concentration below the source/drain 56 remains In contrast to the prior art pocket implantation, the method of performing a pocket implantation according to the present invention requires only two ion implantation processes with the same tilt angle but in opposite directions. The present method uses the height of the gate electrode layer to prevent ion implantation into the source/drain of the NMOS transistor, and so the present invention method is self-aligning and selective to maintain the integrity of the crystalline structure and the carrier concentration below the contact hole of the lower storage node.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of performing a pocket implantation on a MOS transistor of a memory cell of a dynamic random access memory (DRAM), the DRAM being formed on a predetermined area of a semiconductor wafer and comprising a plurality of memory cells arranged in a matrix format on the predetermined area, each of the memory cells comprising a transistor which comprises a substrate, a gate electrode layer with a rectangular vertical cross section positioned on the substrate, two spacers positioned on two opposite side walls of the gate electrode layer, two lightly doped layers positioned on the surface of the substrate below the two spacers, and two heavily doped layers positioned on the surface of the substrate next to the two opposite side walls of the gate electrode layer and not covered by the two spacers; the method comprising:

performing a first ion implantation process to implant ions into a region below one of the two lightly doped layers in a first direction to form a first pocket implantation region wherein the first direction depends on a shape of the gate electrode layer; and performing a second ion implantation process to implant ions into a region below the other lightly doped layer in a second direction to form a second pocket implantation region;

wherein the angle between the first direction and the surface of the semiconductor wafer is the same as the angle between the second direction and the surface of the semiconductor wafer, and the horizontal direction projected from the first direction over the surface of the semiconductor wafer is opposite to that of the second direction.

2. The method of claim 1 wherein the first direction and the second direction are both perpendicular to a channel width direction of the transistor.

3. The method of claim 1 wherein the transistor is an N-type transistor.

4. The method of claim 3 wherein both the first ion implantation process and the second ion implantation process employ boron (B) as the main implantant.

5. The method of claim 3 wherein the main implantant of the two lightly doped layers and the two heavily doped layers is phosphorous (P).

6. The method of claim 1 wherein the angle between the first direction and the surface of the semiconductor wafer is determined by the following formula:

$$\tan \theta = (W-d)/H$$

where $\theta$ is the angle between the first direction and the surface of the semiconductor wafer, W is the distance between two gate electrode layers, d is the width of the pocket implantation region, and H is the height of the gate electrode layer.

* * * * *